US008969735B2

(12) United States Patent
Chow et al.

(10) Patent No.: US 8,969,735 B2
(45) Date of Patent: Mar. 3, 2015

(54) FLEXIBLE METAL INTERCONNECT STRUCTURE

(71) Applicant: Palo Alto Research Center Incorporated, Palo Alto, CA (US)

(72) Inventors: Eugene M. Chow, Fremont, CA (US); Dirk DeBruyker, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 127 days.

(21) Appl. No.: 13/802,701

(22) Filed: Mar. 13, 2013

(65) Prior Publication Data

US 2014/0268596 A1 Sep. 18, 2014

(51) Int. Cl.
*H05K 1/11* (2006.01)
*H05K 1/02* (2006.01)

(52) U.S. Cl.
CPC ................... *H05K 1/0277* (2013.01)
USPC .......................... 174/261; 361/776

(58) Field of Classification Search
CPC ............... H01L 2924/00; H01L 2224/16225; H01L 2224/32225; H01L 2224/13111; H01L 2224/136; H01L 2224/48091; H01L 2224/48227; H01L 2224/73204; H01L 2224/73265; H01L 2924/014
USPC .................. 174/258–261; 361/760, 776, 778
See application file for complete search history.

(56) References Cited

U.S. PATENT DOCUMENTS

| 3,842,189 | A | 10/1974 | Southgate |
| 5,613,861 | A | 3/1997 | Smith et al. |
| 6,184,065 | B1 * | 2/2001 | Smith et al. .................... 438/117 |
| 6,717,066 | B2 * | 4/2004 | Vandentop et al. ........... 174/260 |
| 6,731,492 | B2 * | 5/2004 | Goodwin-Johansson .... 361/233 |
| 7,053,737 | B2 * | 5/2006 | Schwartz et al. ................ 335/78 |
| 7,127,811 | B2 * | 10/2006 | Mathieu et al. ................. 29/846 |
| 7,547,850 | B2 * | 6/2009 | Kirby et al. .................... 174/260 |

OTHER PUBLICATIONS

Kim, Dae-Hyeong et al. "Stretchable, Curvilinear Electronics Based on Inorganic Materials", Adv. Mater. 2010, 22, pp. 2108-2124.
Kim, Rak-Hwan et al. "Waterproof AlInGaP optoelectronics on stretchable substrates with applications in biomedicine and robotics", Nature Materials, vol. 9, 2010, pp. 929-937.

(Continued)

*Primary Examiner* — Yuriy Semenenko
(74) *Attorney, Agent, or Firm* — Bever, Hoffman & Harms, LLP; Patrick T. Bever

(57) ABSTRACT

A flexible metal interconnect structure for transmitting signals between IC devices in flexible electronic devices is formed between two compliant flexible material layers that are laminated together form a multi-layer flexible substrate. The interconnect structure is formed by two rows of spaced-apart conductive pads (metal islands) attached to the inside (facing) surfaces of the flexible material layers. Compliant micro-contact elements such as micro-springs provide sliding metal pressure contacts that maintain electrical connections between the islands during stretching of the composite sheet. Specifically, at least two micro-contact elements are attached to each metal island in one of the rows, with one element in sliding pressure contact with an associated first metal island in the opposing row and the second element in sliding pressure contact with an associated second metal island. The islands and sliding contacts can be patterned into high density traces that accommodate large strains.

20 Claims, 6 Drawing Sheets

(56) References Cited

OTHER PUBLICATIONS

Wang, Shuodao et al. "Mechanics of curvilinear electronics", Soft Mater 2010, 6, pp. 5757-5763.

Kim, Dae-Hyeong et al. "Materials for multifunctional balloon catheters with capabilities in cardiac electrophysiological mapping and ablation therapy", Nature Materials, vol. 10, 2011, pp. 316-323.

Shubin, Ivan et al. "A package demonstration with solder free compliant flexible interconnects", Proceedings of the 60th Electronic Components and Technology Conference (ECTC), Jun. 1-4, 2010, pp. 1429-1435.

Sun, Jeong-Yun et al. "Inorganic islands on a highly stretchable polyimide substrate", J. of Mater. Res., vol. 24, No. 11, Nov. 2009, 17 pages.

Chow, Eugene M. et al. "Wafer-Level Packaging with Soldered Stress-Engineered Micro-Springs", IEEE Transactions on Advanced Packaging, vol. 32, No. 2, May 2009, pp. 372-278.

* cited by examiner

US 8,969,735 B2

FLEXIBLE METAL INTERCONNECT STRUCTURE

FIELD OF THE INVENTION

The present invention is directed to high density reliable flexible metal interconnect structures for transmitting signals, for example, between IC devices that are mounted on a multi-layer flexible substrate in a flexible electronic device, to multi-layer flexible substrates that include at least one such flexible metal interconnect structure, and to flexible electronic devices formed on such multi-layer flexible substrates.

BACKGROUND OF THE INVENTION

Flexible electronics, also known as flex circuits, is a technology for assembling electronic circuits by mounting electronic devices on flexible plastic substrates, such as polyimide, Polyethylene naphthalate (PEN), Polyetheretherketone (PEEK), transparent conductive polyester film, or for the very stretchy applications, silicone. Silicone substrates can support large strains of 10s to 100s of percent. High performance active inorganic electronics based on established technologies such as single crystal silicon or compound semiconductors can be integrated onto these substrates as islands of material, as these materials cannot support large strains. However, the metal interconnects required to transmit signals between these islands need to tolerate large strains without breaking.

Current approaches towards making flexible metal traces on a flexible substrate involve depositing metal conductors (lines) on pre-strained substrates using designed/controlled buckling patterns. When the pre-strained substrates are released, the deposited metal conductors buckle according to the controlled buckling patterns. When the substrates are subsequently stretched, the buckled sections are pulled into a partially flattened state, whereby electrical connections are maintained. Meandering metal lines are used to accommodate even larger strains.

There are multiple problems with the pre-strained, buckled metal line approach. Pre-tensioning the substrate is cumbersome, and not easily scalable. The meandering metal conductors cannot be patterned to achieve high signal density, as the meanders take up space, particularly for larger strain designs. Similarly, the conductivity is limited because the metal lines can't be wide. Also, the buckling design creates exposed out of plane structures, which is inherently fragile because thin film metal is protruding from the flexible substrate surface, and also does not allow for more complicated multilayer designs without large signal density tradeoffs. Meander designs can be stacked, but require thick (e.g., 300 µm) buffer layers to protect the protruding buckles, so achieving vertical interconnections between the layers would be very difficult and inherently low density due to the large buffer layer thickness.

What is needed is a reliable flexible metal interconnect structure for flexible electronics that has high density, accommodates large strains, and remains in-plane (i.e., does not buckle).

SUMMARY OF THE INVENTION

The present invention is directed to a high density reliable flexible metal interconnect structure including two rows of spaced-apart conductive pads (metal islands) disposed on opposing inner surfaces between two compliant flexible material layers, where compliant micro-contact elements maintain sliding (nonattached) contact between the two rows of conductive pads to form a compliant conductive path when the flexible material layers are stretched or compressed. Because the conductive pads can be sized and positioned in a wide range of patterns, the flexible metal interconnect structure provides a higher higher density interconnect that can accommodate larger strains than possible using conventional meander approaches, and remain in-plane and protected between the flexible material layers, thereby avoiding the problems associated with buckling methods. Moreover, because the conductive pads are not required to bend, they can be formed using thicker metals with larger cross-sections than that used in conventional approaches, thereby providing lower resistivity and higher current conduction than is achievable using the conventional methods.

According to an embodiment of the present invention, the flexible metal interconnect structure is disposed to transmit signals between IC devices in a flexible electronic device, and is formed between two compliant flexible material layers that are laminated together form a multi-layer flexible substrate. The interconnect structure includes a first intermittent pathway formed by spaced-apart (first) conductive pads disposed in an end-to-end arrangement forming on a first inner surface of a first flexible material layer, and a second intermittent pathway formed by spaced-apart second conductive pads disposed in an end-to-end arrangement on a second inner surface of a second flexible material layer, with the two rows of conductive pads arranged in an offset overlapping pattern. Two or more compliant micro-contact elements are attached to each spaced-apart (first) conductive pads, and then the two flexible material layers are laminated together such that each (first) conductive pad is electrically connected to two adjacent (second) conductive pads by associated (first and second) compliant micro-contact elements, respectively (i.e., the first element forms a first conductive path between one of the two second conductive pads and the first conductive pad, and the first element forms a second conductive path between the other of the two second conductive pads and the first conductive pad). An electrical signal transmitted between the two IC devices therefore travels along the flexible metal interconnect structure by alternately transmitting along said first and second intermittent pathways first conductive pads to a second conductive pad2 and back to a first conductive pad) by way of the micro-contact elements. According to an aspect of the invention, the compliant micro-contact elements are disposed in sliding (i.e., nonattached) contact with each of the two second conductive pads, whereby the electrical connection between the conductive pads (metal islands) is maintained during subsequent periods of applied stress or strain to the flexible material layers (e.g., stretching such that a distance between the two second conductive pads is increased) by compliant sliding of one or both of the micro-contact elements along the surfaces of the two second conductive pads.

According to a specific embodiment of the present invention, each compliant micro-contact element is implemented by a micro-spring including an anchor portion that is attached to an associated first conductive pad and disposed parallel to the inner surface of the first flexible material layer, a curved body portion having a first end integrally connected to the anchor portion and curved away from the associated first conductive pad, and a tip portion integrally connected to a second end of the curved body portion, where the anchor portion, body portion and tip portion comprise a highly electrically conductive material (e.g., a gold layer over a spring metal base structure). In an exemplary embodiment, each micro-spring includes a base spring metal including one of molybdenum (Mo), molybdenum-chromium (MoCr) alloy, tungsten (W), a titanium-tungsten alloy (Ti:W), chromium (Cr), copper (Cu), nickel (Ni) and nickel-zirconium alloy (NiZr)) that is formed using any of several known techniques during production of a base substrate (e.g., a package base substrate or in the final stages of IC die fabrication), and an outer plating layer (e.g., gold (Au)). Because such micro-springs are fabricated by existing high volume IC fabrication and production methods, the present invention provides a very low cost flexible metal interconnect structure.

The basic flexible interconnect structure is modified according to various alternative embodiments of the present invention to facilitate additional benefits. Integrated circuit devices are mounted onto the flexible substrate, for example, by way of vias and metallization that connect to end sections of the flexible interconnect structure. Additional layers of metallization are facilitated by etching openings (vias) through outside surface of the flexible material layers, and then bonding an additional flexible layer to the multi-layer flexible substrate by way of micro-springs extending through the openings to contact the existing metal islands.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in flexible metal interconnect structures that may be used, for example, in flexible substrates and flexible circuits. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
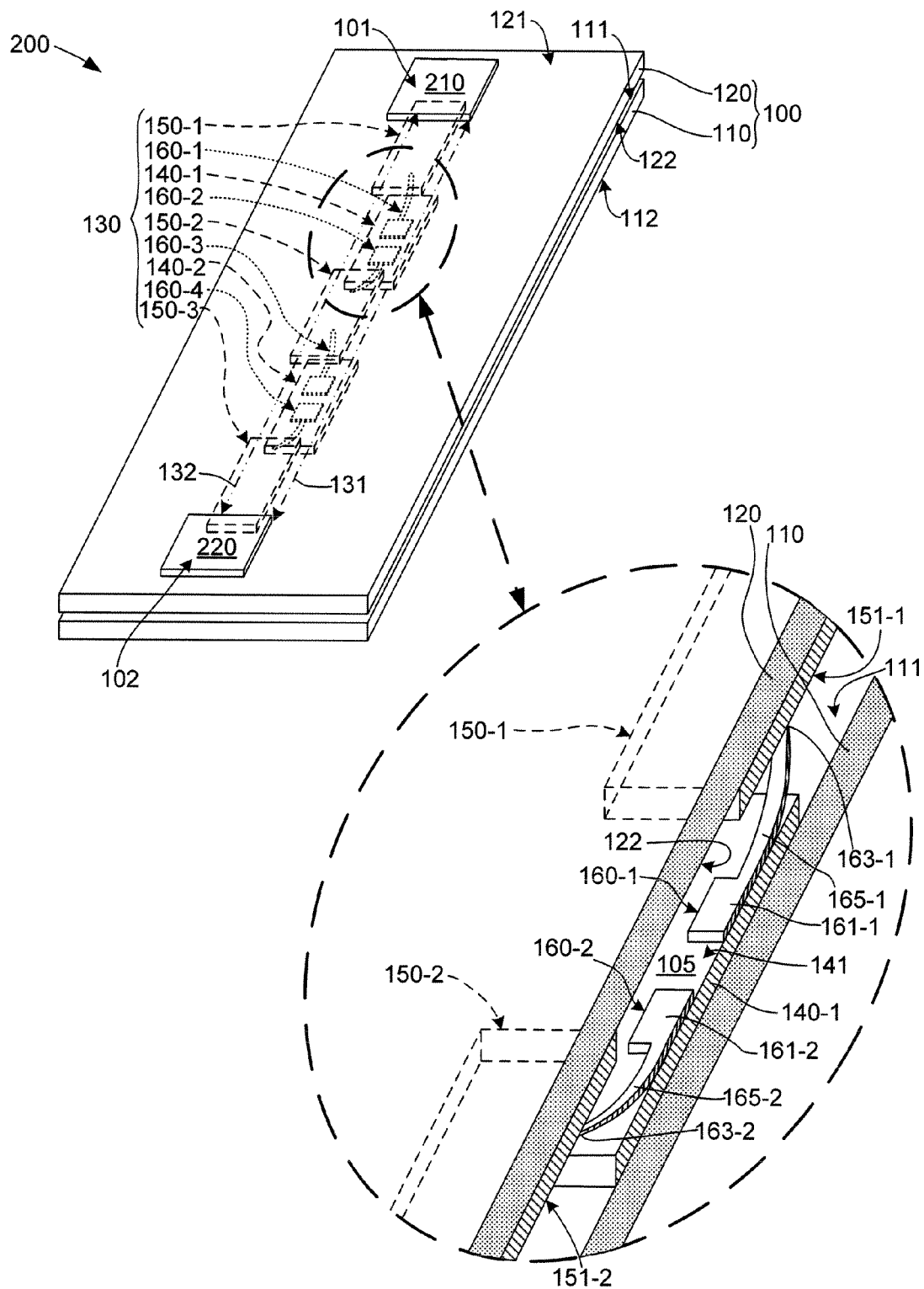
FIG. 1 is a top side perspective view showing a flexible circuit and flexible substrate including a flexible metal interconnect structure according to an embodiment of the present invention.

FIG. 1 shows a flexible electronic device 200 formed on a multi-layer flexible substrate 100 including a flexible metal interconnect structure 130 that is formed in accordance with a greatly simplified exemplary embodiment of the present invention. The present invention is primarily directed to flexible metal interconnect structure 130 (and to the modifications and variations set forth in the following description), which provides a reliable, compliant, high density flexible conductive signal path for transmitting signals, for example, between IC devices 210 and 220 of flexible electronic device 200. Although only one very short flexible metal interconnect structure 130 is described herein for brevity, those skilled in the art recognize that the basic structural features exemplified by flexible metal interconnect structure 130 (along with the modifications set forth below) can be replicated to produce signal paths of any length, and can be implemented multiple times on a single flexible structure. Further, although flexible metal interconnect structure 130 is described below as being integral to multi-layer flexible substrates 100, which in turn is integral to flexible electronic device 200, the inventors recognize that flexible metal interconnect structure 130 may be utilized on other support structures and in other devices as well. As such, the appended claims are not intended to be limited to flexible substrates or flexible electronic devices unless otherwise specified.

Referring the upper portion of FIG. 1, flexible electronic device 200 is formed on a multi-layer flexible substrate 100 and includes a first IC device 210 mounted at a first location 101 on an upper surface 121 of flexible substrate 100, a second IC device 220 mounted at a second location 102 on flexible substrate 100, and a flexible metal interconnect structure 130 that provides a conductive signal path between IC devices 210 and 220 (i.e., between spaced apart locations 101 and 102 of flexible substrate 100).

According to an aspect of the present invention, multi-layer flexible substrate 100 includes two or more flexible material layers that are bonded together, for example, using a suitable adhesive. In the disclosed embodiment, flexible substrate 100 includes a lower (first) flexible material layer 110 and an upper (second) flexible material layer 120, where a (first) inner (i.e., upper) surface 111 of layer 110 is bonded (secured) to a (second) inner (i.e., lower) surface 122 of layer 120. An upper surface 121 of layer 120 forms an outer upper surface of flexible substrate 100, on which IC devices 210 and 220 are mounted, and an lower surface 112 of layer 110 forms an outer lower surface of flexible substrate 100.

According to another aspect of the present invention, flexible metal interconnect structure 130 is disposed between flexible material layers 110 and 120, and includes two rows of spaced-apart conductive pads (metal islands) that are respectively disposed on inner surfaces 111 and 122. The first row of conductive pads includes "spring" pads 140-1 and 140-2, which are secured to inner upper surface 111 of layer 110 and disposed in an end-to-end arrangement such that they form a first intermittent stepping-stone-type pathway 131 extending between locations 101 and 102. The second row of conductive pads includes "slide" pads 150-1, 150-2 and 150-3, which are secured to inner upper surface 122 of layer 120 and are also disposed in an end-to-end arrangement such that they form a second intermittent pathway 132 between locations 101 and 102. In an exemplary embodiment, conductive pads 140-1, 140-2, 150-1, 150-2 and 150-3 include rectangular aluminum blocks having a gold upper layer that are respectively secured to surfaces 111 and 122 by a suitable adhesive.

According to another aspect of the present invention, the two rows of conductive pads are connected together by a series of compliant micro-contact elements 160-1 to 160-4 to form a chain-like conductive path. Because intermittent pathways 131 and 132 are formed by spaced-apart metal islands, signals cannot be transmitted between locations 101 and 102 on either of intermittent pathways 131 and 132 individually. To facilitate signal transmission between locations 101 and 102, the two rows of conductive pads are disposed in an offset overlapping pattern, and compliant micro-contact elements 160-1 to 160-4 are disposed between one conductive pad of pathway 131 and an associated conductive pad of pathway 132, thereby linking the two sets of conductive pads to form a single chain-like conductive path. Specifically, conductive spring pad 140-1 is electrically connected to conductive slide pad 150-1 by a first micro-contact element 160-1, and is electrically connected to conductive slide pad 150-2 by a second micro-contact element 160-2. Similarly, conductive spring pad 140-2 is electrically connected to conductive slide pad 150-2 by a first micro-contact element 160-3, and is electrically connected to conductive slide pad 150-3 by a second micro-contact element 160-4. As such, an electrical signal transmitted between locations 101 and 102 along flexible metal interconnect structure 130 is alternately transmitted along the conductive pads forming intermittent pathways 131 and 132 (i.e., between spring pads 140-1 and 140-2 and conductive slide pads 150-1, 150-2 and 150-3) by way of said plurality of micro-contact elements 160-1 to 160-4. Specifically, a signal transmitted from location 101 onto slide pad 150-1 is transmitted to spring pad 140-1 by way of element 160-1, from spring pad 140-1 to slide pad 150-2 by way of element 160-2, from slide pad 150-2 to spring pad 140-2 by way of element 160-3, from spring pad 140-2 to slide pad 150-3 by way of element 160-4, and from slide pad 150-3 to location 102.

As indicated by the enlarged section shown in the oval bubble in FIG. 1, in the exemplary embodiment micro-contact elements 160-1 to 160-4 are finger-like micro-springs having an anchor (first end) portion fixedly attached to a corresponding spring pad, and a tip (second end) portion contacting an associated slide pad. For example, micro-contact element 160-1 includes an anchor portion 161-1 fixedly attached to an upper surface 141 of spring pad 140-1, a curved body portion 165-1 integrally connected to and extending from anchor portion 161-1, and a tip portion 163-1 integrally connected to a free (second) end of body portion 165-1 and contacting surface 151-1 of slide pad 150-1. Similarly, micro-contact element 160-2 includes an anchor portion 161-2 fixedly attached to surface 141, a curved body portion 165-2 extending from anchor portion 161-2, and a tip portion 163-2 integrally connected to a free (second) end of body portion 165-1 and contacting surface 151-2 of slide pad 150-2. Note that, due to the characteristic upward-bending curve of micro-spring 160, a gap region 105 (e.g., filled with air) is defined between spring pad 140-1 and slide pads 150-1 and 150-2.

Figure 2:
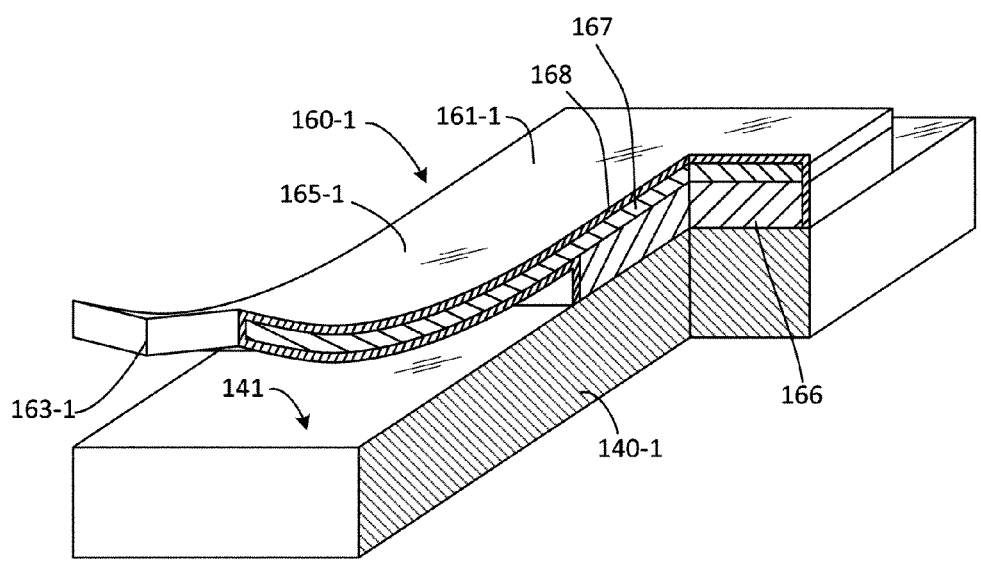
FIG. 2 is a top side perspective view showing a micro-spring utilized in the flexible substrate of FIG. 1.

Each micro-spring 160-1 to 160-4 includes a conductive spring structure that resiliently biases its tip portion away from a host spring pad. For example, as indicated by micro-spring 160-1 in FIG. 2, anchor portion 161-1 is disposed parallel to surface 141 of "host" spring pad 140-1, and body portion 165-1 curves away from surface 141 such that tip portion 163-1 is held away from surface 141. As also indicated in FIG. 2, anchor portion 161-1, body portion 165-1 and tip portion 163-1 comprise both spring-like and electrically conductive materials (e.g., a gold layer 168 formed over a spring metal "core" 167). Spring metal "core" 167 is formed using the methods described below to form a resilient structure that biases tip portion 163-1 away from surface 141 (i.e., if a downward force is applied to micro-spring 160-1 that causes downward deflection of tip portion 163-1, tip portion 163-1 resiliently returns substantially to its initial position upon removal of the downward force).

According to yet another aspect of the present invention, micro-contact elements 160-1 to 160-4 form micro sliding metal pressure contacts that maintain sliding (nonattached) contact between the two rows of conductive pads to form a compliant conductive path even when flexible substrate 100 is subjected to tensile or compressive stress (i.e., stretched or compressed). In the exemplary embodiment, the tip portions of micro-contact element 160-1 to 160-4 are maintained in nonattached sliding contact with its associated slide pad by each spring's resilient bias. For example, referring to the enlarged bubble section in FIG. 1, the upward spring bias of curved micro-spring 160-1 maintains tip portion 163-1 in nonattached (sliding) contact with surface 151-1 of slide pad 150-1, and the upward spring bias of curved micro-spring 160-2 maintains tip portion 163-2 in nonattached (sliding) contact with surface 151-2 of slide pad 150-2.

Figure 3A:
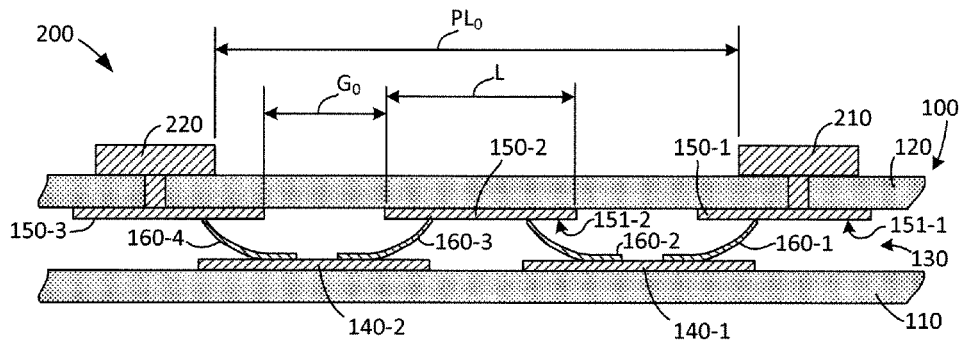
FIGS. 3(A), 3(B) and 3(C) are simplified cross-sectional side views showing the flexible substrate of FIG. 1 under various strain conditions.
Figure 3B:
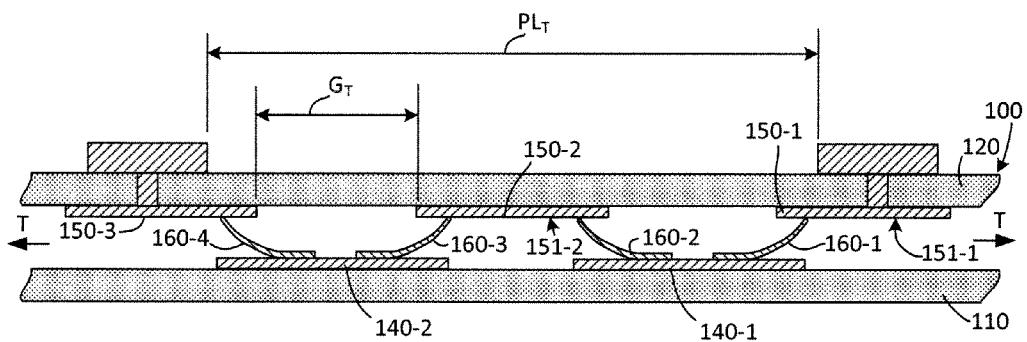
Figure 3C:
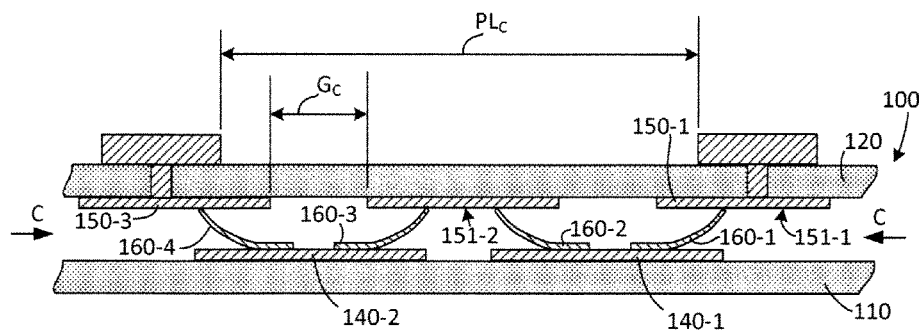

FIGS. 3(A) to 3(C) show flexible circuit 200 under various stress conditions, and illustrates how an electrical signal is transmitted between IC devices 210 and 220 even when flexible substrate 100 is stretched or compressed.

FIG. 3(A) shows flexible circuit 200 in a resting (unstressed) state, where a resting gap distance $G_o$ separating adjacent metal islands (e.g., slide pads 150-2 and 150-3) is substantially the same as when flexible substrate 100 is initially assembled. A resting path length $PL_O$ of flexible metal interconnect structure 130 is basically determined by the total number of metal islands, the pad lengths L of each metal island, and the resting gap distances $G_o$ between the metal islands. Note that in the resting state, the tip portions of micro-springs 160-1 to 160-4 are disposed well away from the edges of slide pads 150-2 and 150-3.

As indicated in FIG. 3(B), when flexible substrate 100 is stretched (e.g., subjected to a tensile force T), the flexible material (e.g., silicone) of layers 110 and 120 between the metal islands stretches, whereby the stretched gap distance $G_S$ between each adjacent pair of metal islands becomes larger than resting gap distance $G_0$, which produces a stretched path length $PL_S$ of flexible metal interconnect structure 130 that is larger than the resting path length $PL_O$. The metal islands are relatively stiff and do not experience significant strain, and therefore do not add to the stretched path length $PL_S$. To provide the desired electrical path under the stretched condition (i.e., to accommodate the larger gap distances between metal islands), the tip portions of micro-springs 160-1 to 160-4 slide toward the outside edges of slide pads 150-1 to 150-3. Note that micro-springs 160-1 to 160-4 are small enough to minimize strain on the metal, but large enough to maximize the overall structure conductivity. By providing suitable pad lengths and gap distances, the resulting interconnect structure is capable of accommodating significant tensile forces. The sliding connections thus isolate the metal islands from extrinsic forces such as thermal expansion or mechanical bending.

FIG. 3(C) similarly shows flexible substrate 100 when compressed (e.g., subjected to a compressive force C), where the flexible material of layers 110 and 120 between the metal islands is pressed together, whereby the compressed gap distance $G_C$ between each adjacent pair of metal islands becomes smaller than resting gap distance $G_0$, which produces a compressed path length $PL_C$ of flexible metal interconnect structure 130 that is smaller than the resting path length $PL_0$. Similar to the stretched condition, to provide the desired electrical path under the compressed condition (i.e., to accommodate the smaller gap distances between metal islands), the tip portions of micro-springs 160-1 to 160-4 slide toward the centers of slide pads 150-1 to 150-3.

By altering the pad lengths and resting gaps separating the metal islands, and by adjusting the positions of the micro-springs, high density flexible metal interconnect structures are achievable that accommodate a wide range of strains. In one practical example, a flexible metal interconnect structure having 275 μm square metal islands (i.e., spring pads and slide pads) disposed at a pitch of 400 μm successfully supported strains of over 40% and exhibited both higher density and multiple-times lower resistance than comparably configured "meander" type interconnect structures. Because the metal island size and pitch can be adjusted without requiring additional space, the flexible metal interconnect structures of the present invention more easily scalable to larger strains and higher densities than the conventional meander approach, and remain in-plane under stress (i.e., metal doesn't pop out of plane during stress like conventional pre-stressed buckling approaches). Moreover, because the metal islands are not required to bend, they can be formed using thicker metal films with larger cross-sections than can be used in conventional buckle and meander approaches, thereby providing flexible interconnect structures exhibiting lower resistivity and higher current conduction than is achievable using the conventional methods.

FIGS. 4(A) to 4(D) show a basic fabrication process utilized to produce flexible metal interconnect structure 130 according to another embodiment of the present invention.

Figure 4A:
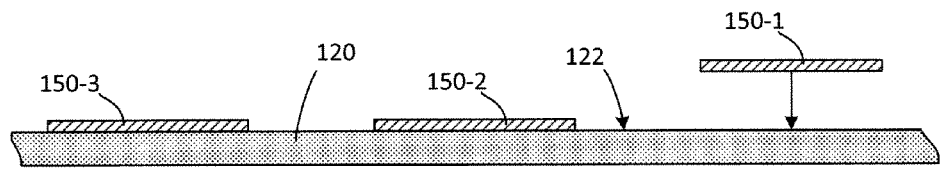
FIGS. 4(A), 4(B), 4(C) and 4(D) are cross-sectional side views showing a production process utilized to manufacture the flexible substrate of FIG. 1.

FIG. 4(A) shows the formation of slide pads (metal islands) 150-1 to 150-3 on flexible material layer 120. In alternative embodiments, slide pads 150-1 to 150-3 are pre-formed and assembled on surface 122, or fabricated (e.g., deposited by printing or formed from a patterned metal layer) directly on surface 122. In one embodiment a low-cost base material (e.g., aluminum) is utilized to provide strength, and a highly conductive material layer (e.g., gold) is formed on the base material to enhance electrical conduction.

Figure 4B:
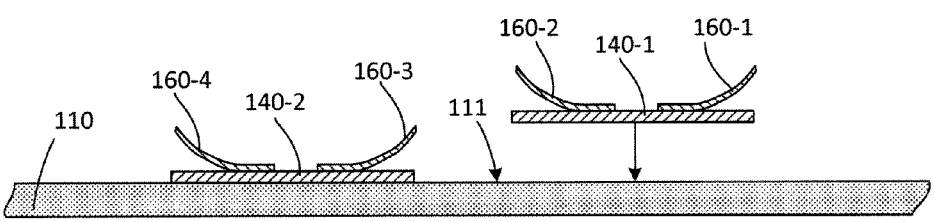

FIG. 4(B) shows the formation of spring pads (metal islands) 140-1 and 140-2 on inner surface 111 of flexible material layer 110, and the formation of compliant micro-contact elements 160-1 to 160-4 on spring pads 140-1 and 140-2. Spring pads 140-1 and 140-2 are formed, for example, using the same materials and techniques as those described above with reference to the slide pads. Micro-springs 160-1 to 160-4 are formed on an associated spring pads 140-1 and 140-2 using any of several possible processes. In one embodiment, the micro-springs are formed using a self-bending spring metal material that is deposited as a stress-engineered film and is then patterned to form spring material islands (flat structures) in which its lowermost portions (i.e., the deposited material adjacent to spring pads 140-1 and 140-2) has a lower internal tensile stress than its upper portions (i.e., the horizontal layers located furthest from spring pads 140-1 and 140-2), thereby causing the stress-engineered metal film to have internal stress variations that cause a narrow "finger" portion of the spring metal island to bend upward away from spring pads 140-1 and 140-2 during the subsequent release process. Methods for generating such internal stress variations in stress-engineered metal films are taught, for example, in U.S. Pat. No. 3,842,189 (depositing two metals having different internal stresses) and U.S. Pat. No. 5,616,861 (e.g., single metal sputtered while varying process parameters), both of which being incorporated herein by reference. In one embodiment, a titanium (Ti) release material layer is deposited on surface 111, then a stress-engineered metal film includes one or more of molybdenum (Mo), a "moly-chrome" alloy (MoCr), tungsten (W), a titanium-tungsten alloy (Ti:W), chromium (Cr), copper (Cu), nickel (Ni) and a nickel-zirconium alloy (NiZr) are either sputter deposited or plated over the release material. An optional passivation metal layer (not shown; e.g., gold (Au), platinum (Pt), palladium (Pd), or rhodium (Rh)) may be deposited on the upper surface of the stress-engineered metal film to act as a seed material for the subsequent plating process if the stress-engineered metal film does not serve as a good base metal. The passivation metal layer may also be provided to improve contact resistance in the completed spring structure. In an alternative embodiment, a nickel (Ni), copper (Cu) or nickel-zirconium (NiZr) film may be formed that can be directly plated without a seed layer. If electroless plating is used, the deposition of the electrode layer can be skipped. In yet another alternative embodiment, the self-bending spring material may be one or more of a bimorph/bimetallic compound (e.g., metal1/metal2, silicon/metal, silicon oxide/metal, silicon/silicon nitride) that are fabricated according to known techniques. In each instance an outer layer of highly conductive material (e.g., gold) is formed on the "base" spring metal material to increase conductivity and to facilitate micro-plasma generation. In yet another embodiment depicted in FIG. 2, each micro-spring is fabricated such that its anchor portion (e.g., anchor portion 161-1) is connected to the host spring pad by way of an optional conductive support structure 166 (e.g., a retained portion of the release layer or a pre-formed metal base structure).

Figure 4C:
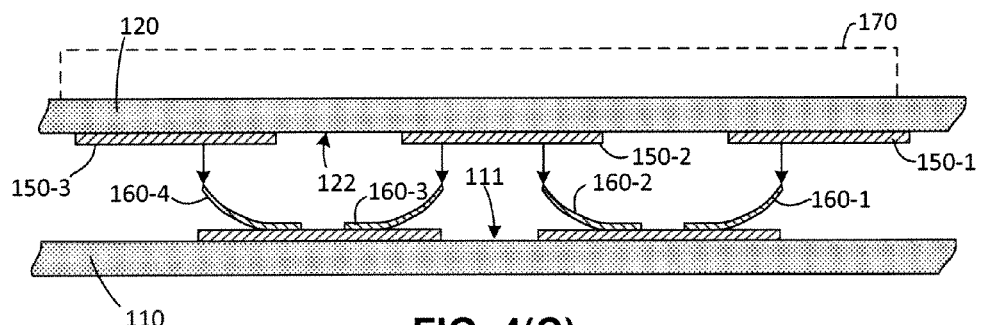

After completing flexible layers 110 and 120, the two layers are aligned for connection as shown in FIG. 4(C) (i.e., oriented such that surface 122 faces surface 111, and aligned such that the tip portion of micro-spring 160-1 is aligned with slide plate 150-1, the tip portions of micro-springs 160-2 and 160-3 are aligned with slide plate 150-2, and the tip portion of micro-spring 160-4 is aligned with slide plate 150-3. In one specific embodiment, a removable handle substrate 170 is attached to the backside surface of layer 120 to provide temporary structural support during assembly.

Figure 4D:
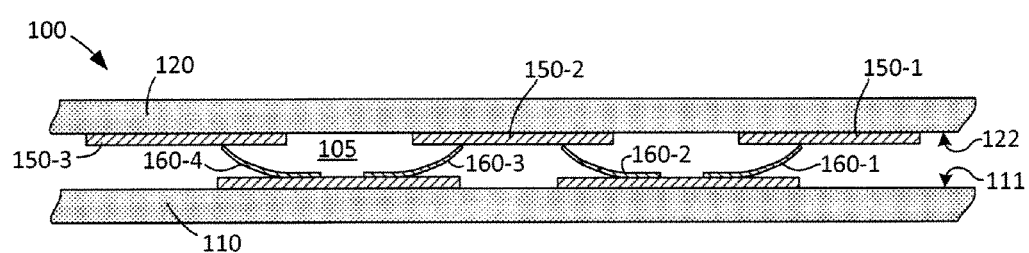

FIG. 4(D) illustrates the final fabrication process involving bonding of flexible layers 110 and 120 such that micro-springs 160-1 to 160-4 make sliding contact with slide plates 150-1 to 150-3. Note that micro-springs 160-1 to 160-4 are not entirely flattened during the assembly process, leaving a small (e.g., air-filled) gap 105 between the spring and slide pads. In one embodiment the spring tips are coated with a stable metal such as gold to absorb relative translation between the two flexible material layers while maintaining electrical contact. In one embodiment layers 110 and 120 are bonded with silicone to silicone bonds based on standard surface treatments.

Figure 5A:
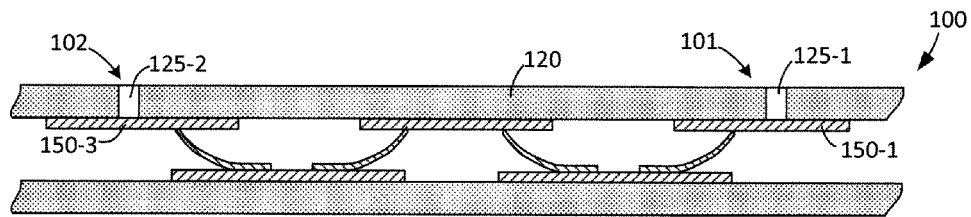
FIGS. 5(A), 5(B) and 5(C) are cross-sectional side views showing a production process utilized to manufacture the flexible circuit of FIG. 1.
Figure 5B:
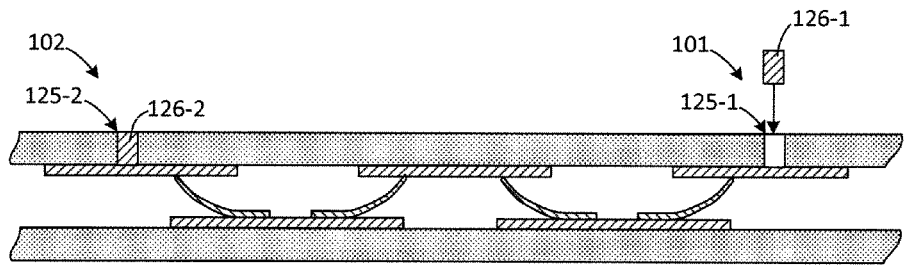
Figure 5C:
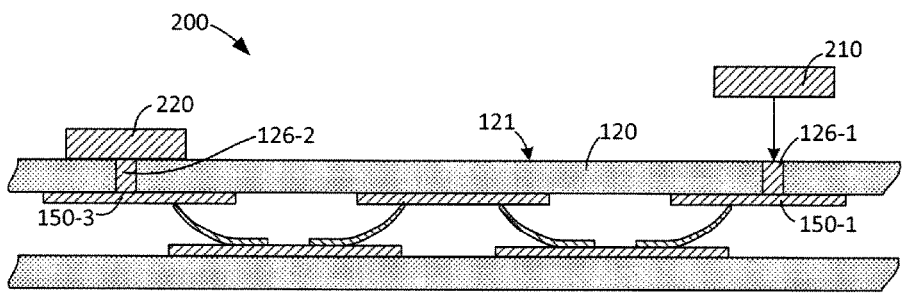

FIGS. 5(A) to 5(C) illustrate the integration of IC devices (chips) onto flexible substrate 100 according to an exemplary embodiment. As indicated in FIG. 5(A), portions of flexible material layer 120 at locations 101 and 102 are etched or otherwise removed to form openings 125-1 and 125-2 that respectively expose portions of slide pads 150-1 and 150-3. As shown in FIG. 5(B), metallization is then performed using known techniques to provide metal via conductors 126-1 and 126-2 inside openings 125-1 and 125-2, respectively (i.e., such that metal via conductors 126-1 and 126-2 extend through flexible material layer 120), whereby metal via conductors 126-1 and 126-2 form end portions of the flexible metal interconnect structure extending between locations 101 and 102. As shown in FIG. 5(C), IC devices 210 and 220 are then mounted onto upper surface 121 of flexible material layer 120 such that contact pads (not shown) of each device 210 and 220 make electrical contact with slide pads 150-1 and 150-3 by way of metal conductors 126-1 and 126-2, respectively, thereby completing simplified flexible electronic device 200.

Figure 6A:
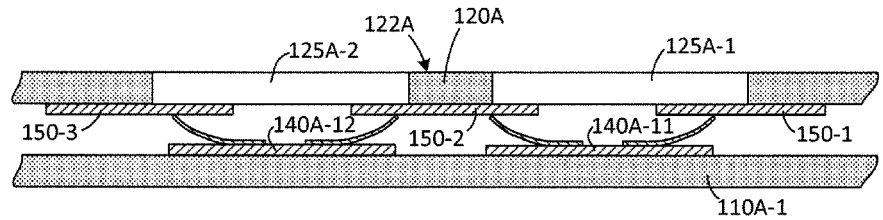
FIGS. 6(A), 6(B) and 6(C) are cross-sectional side views showing the production of a flexible circuit according to an alternative embodiment of the present invention.
Figure 6B:
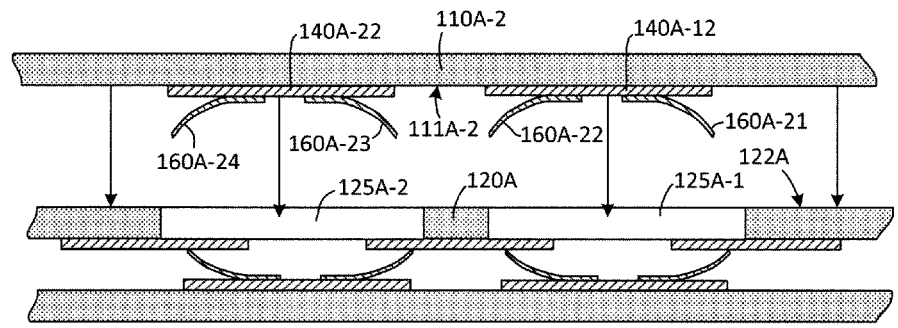
Figure 6C:
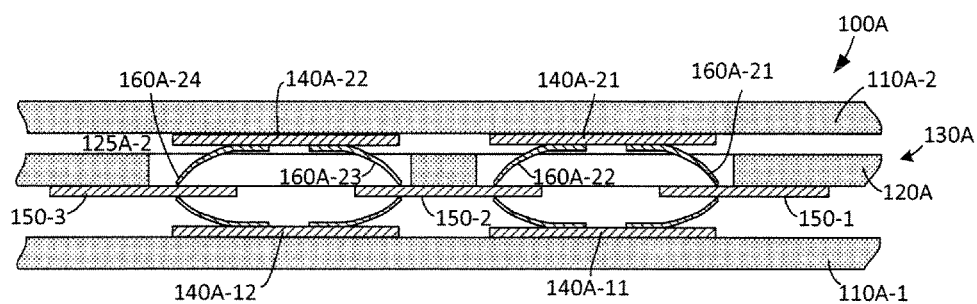

FIGS. 6(A) to 6(C) illustrate the expansion of a two-layer flexible substrate to form a three-layer flexible substrate 100A according to another embodiment of the present invention. Referring to FIG. 6(A), a two layer flexible substrate formed by first flexible material layer 110A-1 and second flexible material layer 120A is constructed such that spring pads 140A-11 and 140A-12 disposed on layer 110A-1 contact slide pads 150-1 to 150-3 by way of intervening micro-springs in the manner described above. This two-layer flexible substrate is modified to include vias (openings) 125A-1 and 125A-2 that are formed through layer 120A and expose backside (upper) portions of slide pads 150-1 to 150-3. A third flexible material layer 110A-2, which includes spring pads 140A-21 and 140A-22 and associated micro-springs 160A-21 to 160A-24 arranged in a pattern similar to that of lower flexible material layer 110A-1, is positioned over 122A of upper flexible material layer 120A such that micro-springs 160A-21 and 160A-22 are aligned with via 125A-1, and such that micro-springs 160A-23 and 160A-24 are aligned with via 125A-2. As indicated in FIG. 6(C), layer 110A-2 is then mounted and secured to layer 120A such that micro-springs 160A-21 and 160A-22 extend through via 125A-1 and make contact with the backside (upper) surfaces of slide pads 150-1 and 150-2, and such that micro-springs 160A-23 and 160A-24 extend through via 125A-2 and make contact with the backside (upper) surfaces of slide pads 150-2 and 150-3. In this example, the resulting structure provides a flexible metal interconnect structure 130A having redundant signal paths from slide pads 150-1 to 150-3 (e.g., either by way of spring pad 140A-21, slide pad 150-2 and then spring pad 140A-22, or by way of spring pad 140A-11, slide pad 150-2 and then spring pad 140A-12). This redundant signal path arrangement provides protection against broken or otherwise non-contacting micro-springs. Further, by adding additional layers in the manner illustrated in FIGS. 6(A) to 6(C), a flexible substrate having any number of layers can be constructed (or a damaged flexible metal interconnect structure can be repaired) by etching vias through the back of an existing outer substrate, and then bonding another flexible material layer having a prearranged series of metal islands and springs that rovide contact through the vias.

Although the present invention has been described with respect to certain specific embodiments, it will be clear to those skilled in the art that the inventive features of the present invention are applicable to other embodiments as well, all of which are intended to fall within the scope of the present invention. For example, the micro-springs utilized in the disclosed embodiments can be oriented in multiple directions on the metal islands to accommodate strains in different directions. Registration aids, such as dummy pad metal patterns, can be used to aid bonding alignment of the spring and pad substrates. Pseudo random spring arrangements could be also used. Bonding of the spring and pad substrates can be done with minimal or no alignment. Lubrication can be used on the spring tip regions to aid reliability during sliding. Substrate composites can be used, such as with a thin silicone on a stiffer polyimide. Further, using known techniques, micro-springs could be fabricated but not released until after bonding to the pad substrate (e.g., thermal or optical release methods could be used to release the springs; the spring tips to do not need to physically to have their force increase to establish the electrical contact). In addition to stress engineered springs described above, other compliant metal interconnects could be used. For example, flexible conductive materials such as polymers or liquids could be used to form the micro-contact elements, where such elements could slide against a pad to accommodate relative displacement, or could bend.

The invention claimed is:

1. A flexible metal interconnect structure comprising:
   a plurality of spaced-apart first conductive pads disposed in an end-to-end arrangement on a first inner surface of a first flexible material layer such that the plurality of spaced-apart first conductive pads form a first intermittent pathway;
   a plurality of spaced-apart second conductive pads disposed in an end-to-end arrangement on a second inner surface of a second flexible material layer such that the plurality of spaced-apart second conductive pads form a second intermittent pathway; and
   a plurality of compliant micro-contact elements disposed in sliding contact between the first and second conductive pads such that each first conductive pad is electrically connected to two adjacent second conductive pads by associated first and second compliant micro-contact elements, whereby an electrical signal transmitted between first and second locations along said flexible metal interconnect structure is alternately transmitted along said first and second intermittent pathways between said first conductive pads and said second conductive pads by way of said plurality of micro-contact elements.

2. The flexible metal interconnect structure according to claim 1,
   wherein the first and second flexible material layers comprise one of polyimide, PEN, PEET, and silicone, and
   wherein each of the plurality of spaced-apart first and second conductive pads comprises an aluminum base structure secured to the first and second flexible material layers, respectively.

3. The flexible metal interconnect structure according to claim 2, wherein each of the plurality of spaced-apart first and second conductive pads further comprises an outer gold layer disposed over the aluminum base structure.

4. The flexible metal interconnect structure according to claim 1, wherein a first end of each of the plurality of compliant micro-contact elements is fixedly attached to a corresponding first conductive pad, and is disposed in sliding contact with an associated second conductive pad.

5. The flexible metal interconnect structure according to claim 4, wherein each of the plurality of micro-contact elements comprises a curved micro-spring including an anchor portion disposed parallel to the first inner surface of the first flexible material layer, a curved body portion having a first end integrally connected to the anchor portion and curved away from first inner surface, and a tip portion integrally connected to a second end of the curved body portion, the anchor, body and tip portions comprising an electrically conductive material, wherein the tip portion of each said curved micro-spring is in nonattached contact with an associated spaced-apart second conductive pads.

6. The flexible metal interconnect structure of claim 5, wherein each said curved micro-spring comprises a spring metal portion including one of molybdenum (Mo), molybdenum-chromium (MoCr) alloy, tungsten (W), a titanium-tungsten alloy (Ti:W), chromium (Cr), copper (Cu), nickel (Ni) and nickel-zirconium alloy (NiZr)), and an outer layer comprising gold (Au).

7. The flexible metal interconnect structure according to claim 4, wherein each of the plurality of spaced-apart first conductive pads includes a first curved micro-spring extending in first direction and a second curved micro-spring extending in second direction opposite to the first direction.

8. The flexible metal interconnect structure according to claim 4, further comprising one or more metal via structures extending from one of said first and second contact pads through one of said first and second flexible material layers.

9. The flexible metal interconnect structure according to claim 1, further comprising:
   a plurality of spaced-apart third conductive pads disposed in an end-to-end arrangement on a third inner surface of a third flexible material layer; that is secured to the second flexible material layer; and
   a second plurality of compliant micro-contact elements disposed in sliding contact between the second and third conductive pads such that each third conductive pad is electrically connected to two adjacent said second conductive pads by associated third and fourth compliant micro-contact elements.

10. The flexible metal interconnect structure according to claim 1, further comprising means for adjusting one or more of said compliant micro-contact elements such that, in a first controlled state, said one or more of said compliant micro-contact elements is connected between an associated first conductive pad and an associated second conductive slide pad, and in a second controlled state, said one or more of said compliant micro-contact elements is disconnected from one of said associated first and second conductive pad.

11. A flexible substrate comprising:
   first and second flexible material layers, the first flexible material layer having a first inner surface that faces and is secured to a second inner surface of the second flexible material layer and
   a flexible metal interconnect structure forming a signal path between first and second locations of the flexible substrate, the flexible metal interconnect structure including:
   a plurality of spaced-apart first conductive pads disposed in an end-to-end arrangement on the first inner surface of the first flexible material layer such that the plurality of spaced-apart first conductive pads form a first intermittent pathway between the first and second locations;
   a plurality of spaced-apart second conductive pads disposed in an end-to-end arrangement on the second inner surface of the second flexible material layer such that the plurality of spaced-apart second conductive pads form a second intermittent pathway between the first and second locations; and
   a plurality of compliant micro-contact elements disposed in sliding contact between the first and second conductive pads such that each first conductive pad is electrically connected to two adjacent second conductive pads by associated first and second compliant micro-contact elements, whereby an electrical signal transmitted between said first and second locations along said flexible metal interconnect structure is alternately transmitted along said first and second intermittent pathways between said first conductive pads and said second conductive pads by way of said plurality of micro-contact elements.

12. The flexible substrate according to claim 11, wherein the first and second flexible material layers comprise one of polyimide, PEN, PEET, and silicone.

13. The flexible substrate according to claim 11, wherein each of the plurality of spaced-apart first and second conductive pads comprises an aluminum base structure and having an outer layer comprising gold.

14. The flexible substrate according to claim 11, wherein a first end of each of the plurality of compliant micro-contact elements is fixedly attached to a corresponding first conductive pad, and is disposed in sliding contact with an associated second conductive pad.

15. The flexible substrate according to claim 14, wherein each of the plurality of micro-contact elements comprises a curved micro-spring including an anchor portion disposed parallel to the first inner surface of the first flexible material layer, a curved body portion having a first end integrally connected to the anchor portion and curved away from first inner surface, and a tip portion integrally connected to a second end of the curved body portion, the anchor, body and tip portions comprising an electrically conductive material, wherein the tip portion of each said curved micro-spring is in nonattached contact with an associated spaced-apart second conductive pads.

16. The flexible substrate according to claim 14, wherein each of the plurality of spaced-apart first conductive pads includes a first curved micro-spring extending in first direction and a second curved micro-spring extending in second direction opposite to the first direction.

17. The flexible substrate according to claim 14, further comprising one or more metal via structures extending from one of said first and second contact pads through one of said first and second flexible material layers.

18. The flexible substrate according to claim 11, further comprising:
   a plurality of spaced-apart third conductive pads disposed in an end-to-end arrangement on a third inner surface of a third flexible material layer; that is secured to the second flexible material layer; and
   a second plurality of compliant micro-contact elements disposed in sliding contact between the second and third conductive pads such that each third conductive pad is electrically connected to two adjacent said second conductive pads by associated third and fourth compliant micro-contact elements.

19. The flexible substrate according to claim 11, further comprising means for adjusting one or more of said compliant micro-contact elements such that, in a first controlled state, said one or more of said compliant micro-contact elements is connected between an associated first conductive pad and an associated second conductive slide pad, and in a second controlled state, said one or more of said compliant micro-contact elements is disconnected from one of said associated first and second conductive pad.

20. A flexible electronic device including at least one integrated circuit device mounted at a first location on a flexible substrate, wherein the said flexible substrate comprises:
   first flexible material layer and second flexible material layer, the first flexible material layer having a first inner surface bonded to a second inner surface of the second flexible material layer; and
   a flexible metal interconnect structure extending between first and second locations of the flexible substrate, the flexible metal interconnect structure including:
   a plurality of spaced-apart first conductive pads disposed in an end-to-end arrangement on the first inner surface of the first flexible material layer such that the plurality of spaced-apart first conductive pads form a first intermittent pathway between the first and second locations;
   a plurality of spaced-apart second conductive pads disposed in an end-to-end arrangement on the second inner surface of the second flexible material layer such that the plurality of spaced-apart second conductive pads form a second intermittent pathway between the first and second locations; and a plurality of compliant micro-contact elements disposed in sliding contact between the first and second conductive pads such that each first conductive pad is electrically connected to two adjacent second conductive pads by associated first and second compliant micro-contact elements, whereby an electrical signal transmitted between said first and second locations along said flexible metal interconnect structure is alternately transmitted along said first and second intermittent pathways between said first conductive pads and said second conductive pads by way of said plurality of micro-contact elements.

* * * * *